United States Patent [19]
Honeycutt

[11] Patent Number: 5,989,946
[45] Date of Patent: *Nov. 23, 1999

[54] METHOD OF FORMING SRAM CELLS AND PAIRS OF FIELD EFFECT TRANSISTORS

[75] Inventor: Jeffrey W. Honeycutt, Boise, Id.

[73] Assignee: Micron Technology, Inc., Boise, Id.

[ * ] Notice: This patent is subject to a terminal disclaimer.

[21] Appl. No.: 08/914,369

[22] Filed: Aug. 19, 1997

Related U.S. Application Data

[63] Continuation of application No. 08/582,446, Jan. 3, 1996, Pat. No. 5,691,217.

[51] Int. Cl.$^6$ .............................. H01L 21/00; H01L 21/84
[52] U.S. Cl. ......................... 438/153; 438/258; 438/241; 148/DIG. 163
[58] Field of Search ..................................... 438/241, 242, 438/258, 153; 148/DIG. 163, DIG. 14, DIG. 136

[56] References Cited

U.S. PATENT DOCUMENTS

| | | | |
|---|---|---|---|
| 4,627,153 | 12/1986 | Masuoka | 437/979 |
| 4,951,112 | 8/1990 | Choi et al. | 365/154 |
| 5,010,521 | 4/1991 | Matsui | 365/154 |
| 5,254,489 | 10/1993 | Nakata | 437/40 GS |
| 5,285,096 | 2/1994 | Ando et al. | 257/380 |
| 5,293,336 | 3/1994 | Ishii et al. | 437/52 |
| 5,327,002 | 7/1994 | Motoyoshi | 257/380 |
| 5,347,152 | 9/1994 | Sundaresan | 257/304 |
| 5,426,065 | 6/1995 | Chan et al. | 547/52 |
| 5,432,114 | 7/1995 | O | 437/979 |
| 5,497,021 | 3/1996 | Tada | 257/392 |
| 5,607,868 | 3/1997 | Chida et al. . | |

FOREIGN PATENT DOCUMENTS

| | | |
|---|---|---|
| 63-105522 | 5/1988 | Japan . |
| 2-71559 | 3/1990 | Japan . |
| 2-96378 | 4/1990 | Japan . |
| 3-42869 | 2/1991 | Japan . |
| 3-71665 | 3/1991 | Japan . |
| 5-275640 | 10/1993 | Japan . |
| 6-21369 | 1/1994 | Japan . |
| 6-120453 | 4/1994 | Japan . |

OTHER PUBLICATIONS

Research Disclosure, "Process to make thick and thin gate dielectric devices on the same chip", 334(2) (Feb. 1992) 117, No. 33428.

Lage, Craig et. al., "Soft Error Rate And Stored Charge Requirements in Advanced High–Density SRAMs", IEEE 1993, IEDM pp. 821–824.

*Primary Examiner*—Chandra Chaudhari
*Assistant Examiner*—Scott J. Hawranek
*Attorney, Agent, or Firm*—Wells, St. John, Roberts, Gregory & Matkin, P.S.

[57] ABSTRACT

A method of forming a pair of field effect transistors having different thickness gate dielectric layers includes, a) providing a first region on a substrate for formation of a first field effect transistor s having a first gate dielectric layer of a first thickness and providing a second region on the substrate for formation of a second field effect transistor having a second gate dielectric layer of a second thickness; b) providing the first gate dielectric layer and a first conductive gate layer over the first and second regions; c) patterning the first conductive layer to define a first gate of the first field effect transistor in the first region while leaving the first conductive layer not patterned for gate formation for the second field effect transistor in the second region; d) after defining the first gate, stripping the first conductive layer and the first gate dielectric layer from the second region; e) after stripping the first conductive layer and the first gate dielectric layer from the second region, providing the second gate dielectric layer and a second conductive gate layer over the second region; and f) patterning the second conductive layer in the second region to define a second gate of the second field effect transistor in the second region. The invention has particular utility in fabrication of SRAM circuitry.

12 Claims, 8 Drawing Sheets

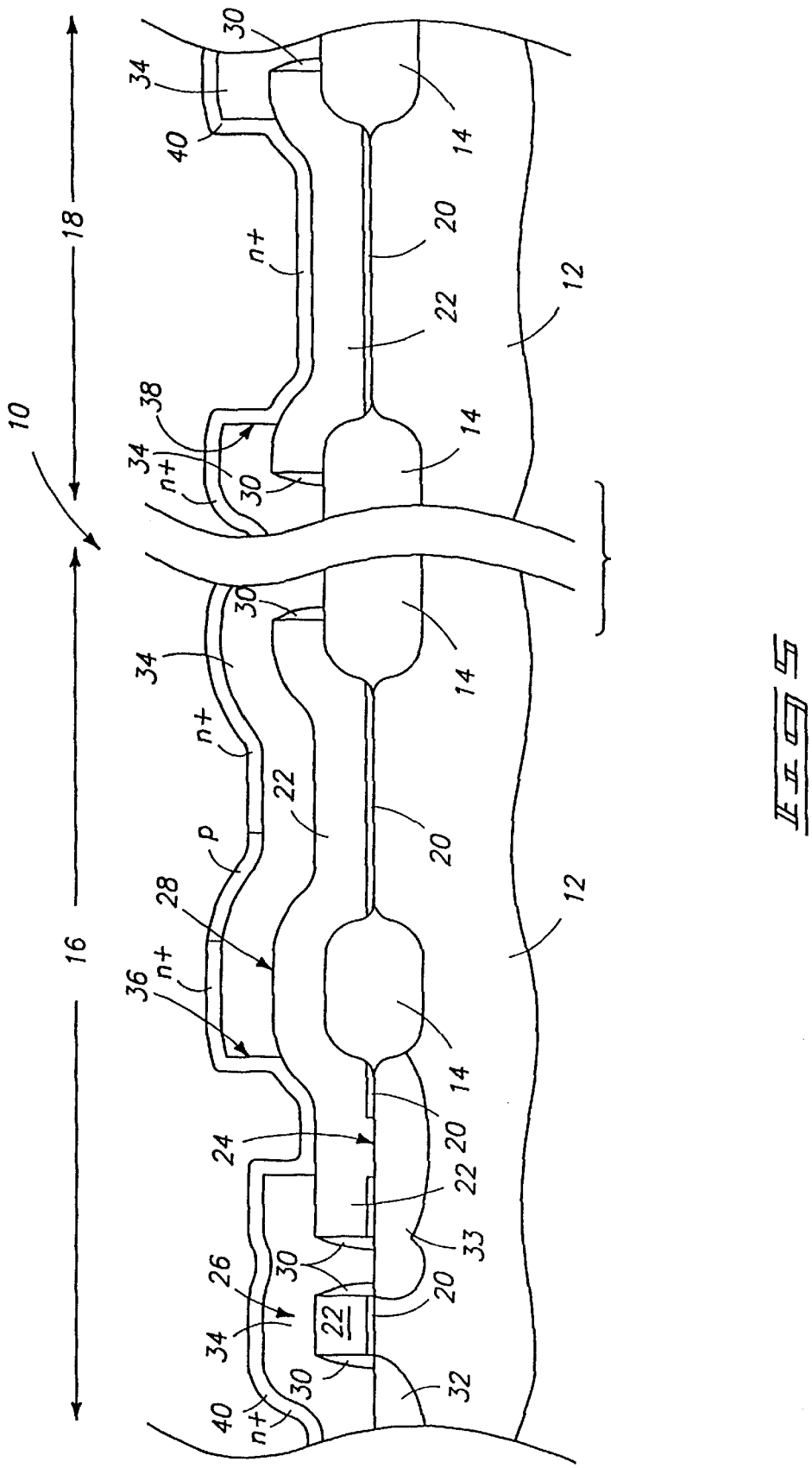

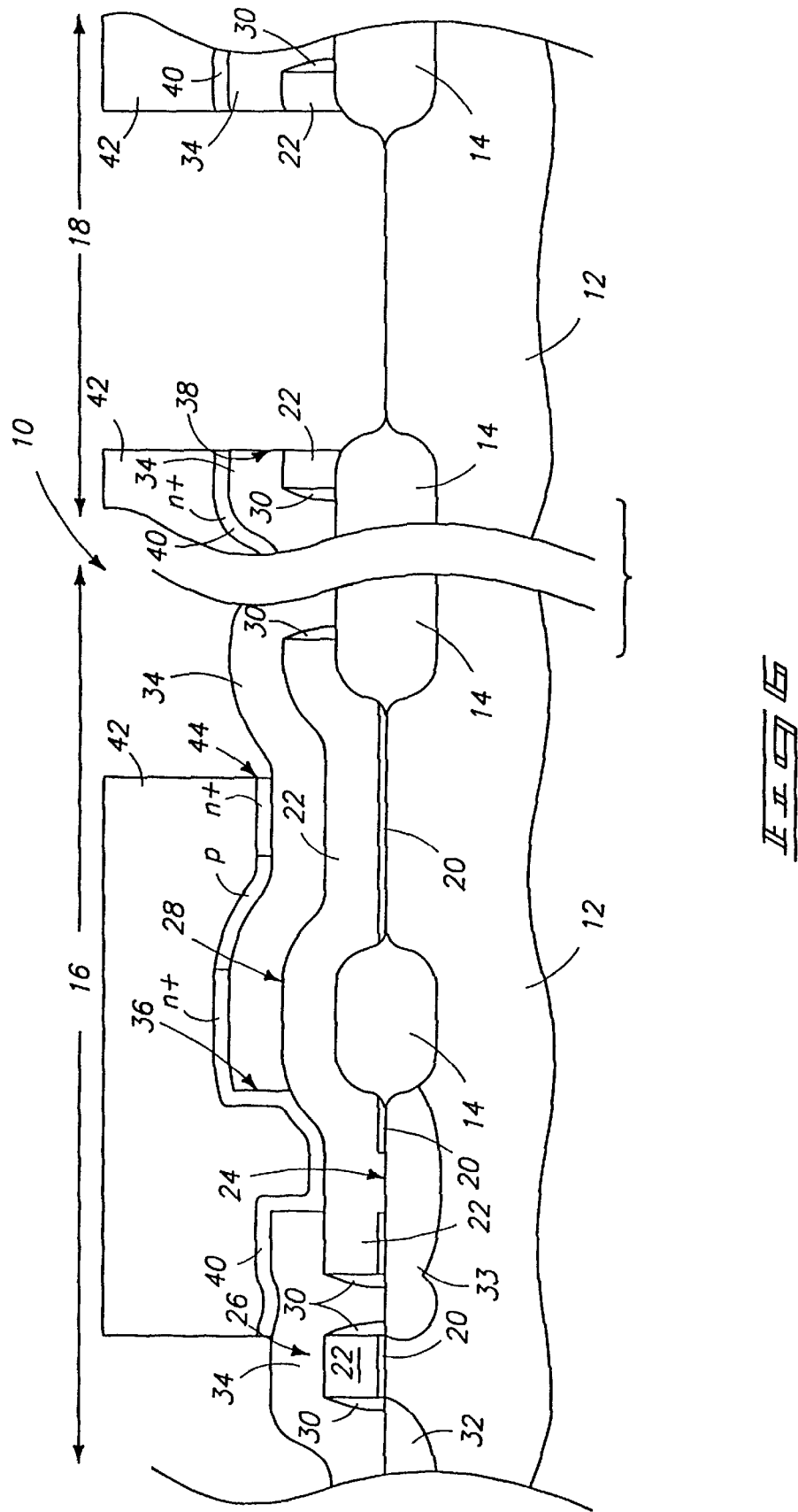

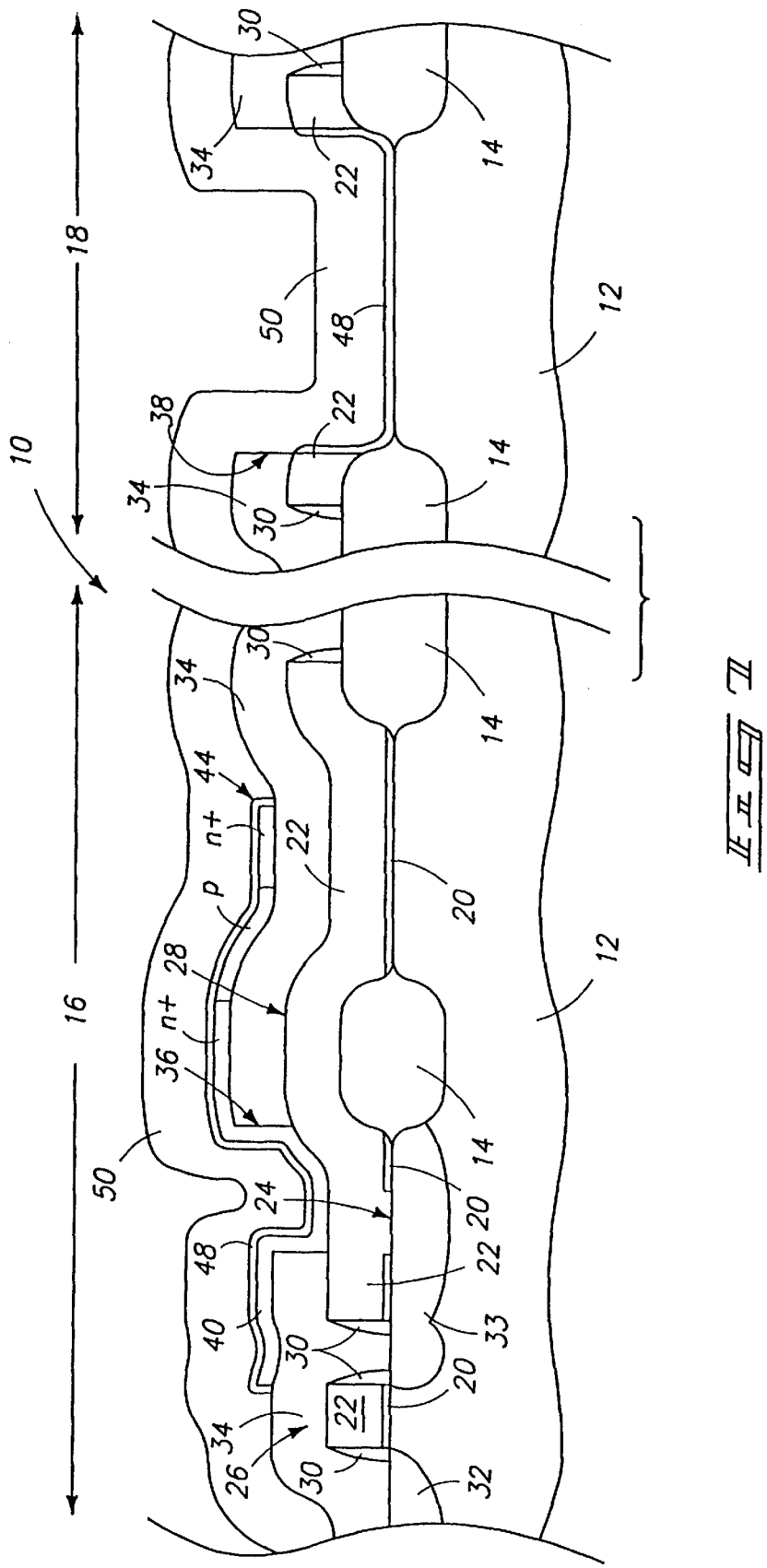

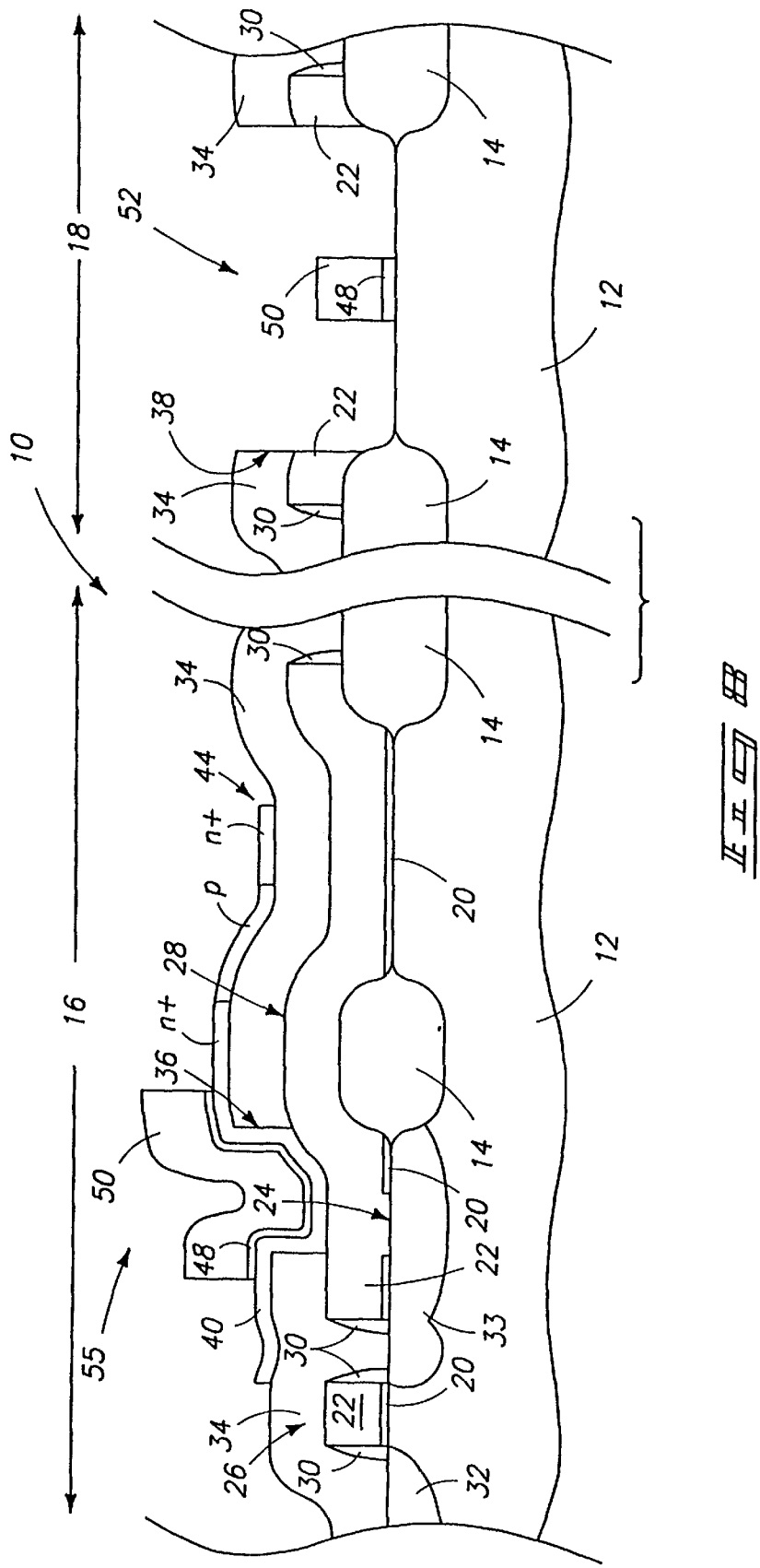

5,989,946

METHOD OF FORMING SRAM CELLS AND PAIRS OF FIELD EFFECT TRANSISTORS

RELATED PATENT DATA

This patent resulted from a continuation application of U.S. patent application Ser. No. 08/582,446, filed on Jan. 3, 1996, U.S. Pat. No. 5,691,217, and listing the inventor as Jeffrey W. Honeycutt.

TECHNICAL FIELD

This invention relates to formation of field effect transistors, to formation of static random access memory (SRAM) circuitry, and to integrated circuitry.

BACKGROUND OF THE INVENTION

This invention arose from challenges associated with fabrication of SRAM circuitry where there is a desirability of fabricating different field effect transistors with different gate dielectric layer thicknesses. The invention will have applicability to other circuitry, such as dynamic random access memory (DRAM) and logic circuitry, as the artisan will appreciate, with the invention only being limited by the accompanying claims appropriately interpreted in accordance with the Doctrine Of Equivalents.

An SRAM cell is said to be bistable because it has two stable or self-maintaining operating states, corresponding to two different output voltages. The different output voltages correspond to a binary stored "1" or a "0". Without external stimuli, a static memory cell will operate continuously in a single one of its two operating states. It has internal feedback to maintain a stable voltage differential between the two nodes of the cell. The polarity of this voltage difference is sensed by external circuitry to determine the operating state of the memory cell. The two possible output voltages produced by a static memory cell are determined by the upper and lower circuit supply voltages. Intermediate output voltages and the performance of the devices in the SRAM cell itself.

The operation of a static memory cell is in contrast to other types of memory cells, such as DRAM cells, which do not have stable operating states. A DRAM cell can be programmed to store a voltage which represents one of two binary values, but requires periodic reprogramming or "refreshing" to maintain this voltage for more than very short time periods.

FIG. 1 shows an example prior art SRAM cell 350 such as is typically used in high-density static random access memories. Static memory cell 350 comprises n-channel pull down (driver) transistors 380 and 382 having drains respectively connected to load resistors 384 and 386. Transistors 380 and 382 are typically metal oxide silicon field effect transistors (MOSFETs) formed in an underlying silicon semiconductor substrate.

The source regions of transistors 380 and 382 are tied to a low reference or circuit supply voltage, labelled $V_{SS}$ which is typically referred to as "ground." Resistors 384 and 386 are respectively connected in series between a high reference or circuit supply voltage, labelled $V_{CC}$, and the drains of the corresponding transistors 380 and 382. The drain of transistor 382 is connected to the gate of transistor 380 by a line 376, and the drain of transistor 380 is connected to the gate of transistor 382 by a line 374 to form flip-flop having a pair of complementary two-state outputs.

A memory flip-flop, such as that described above in connection with FIG. 1, forms one memory element of an integrated array of static memory elements. A pair of access transistors, such as access transistors 390 and 392, are provided to selectively address and access individual memory elements within the array. Access transistor 390 has one active terminal connected to the drain of transistor 380. Access transistor 392 has one active terminal connected to the drain of transistor 382. A plurality of complementary column line pairs, such as the single pair of complementary column lines 352 and 354 as shown, are connected to the remaining active terminals of access transistors 390 and 392, respectively. A row line 356 is connected to the gates of access transistors 390 and 392.

Reading static memory cell 350 requires activating row line 356 to connect outputs 368 and 372 to column lines 352 and 354. Writing to static memory cell 350 requires first placing selected complementary logic voltages on column lines 352 and 354, and then activating row line 356 to connect those logic voltages to outputs 368 and 372. This forces the outputs to the selected logic voltages, which will be maintained as long as power is supplied to the memory cell, or until the memory cell is reprogrammed.

Transistors 380, 382, 390 and 392 are typically fabricated to be NMOS field effect transistors formed from common conductive gate and gate dielectric layers. Typical SRAM circuitry fabrication also includes fabricating other circuitry external to the memory cell and array, some of which utilizes PMOS transistors. In some instances, it would be desirable to provide some of the PMOS transistors with different thickness gate dielectric layers than that used for the NMOS SRAM cell transistors.

BRIEF DESCRIPTION OF THE DRAWINGS

Preferred embodiments of the invention are described below with reference to the following accompanying drawings.

FIG. 5 is a view of the FIG. 2 wafer at a processing step subsequent to that shown by FIG. 4.

FIG. 6 is a view of the FIG. 2 wafer at a processing step subsequent to that shown by FIG. 5.

FIG. 7 is a view of the FIG. 2 wafer at a processing step subsequent to that shown by FIG. 6.

FIG. 8 is a view of the FIG. 2 wafer at a processing step subsequent to that shown by FIG. 7.

DETAILED DESCRIPTION OF THE PREFERRED EMBODIMENTS

Figure 1:
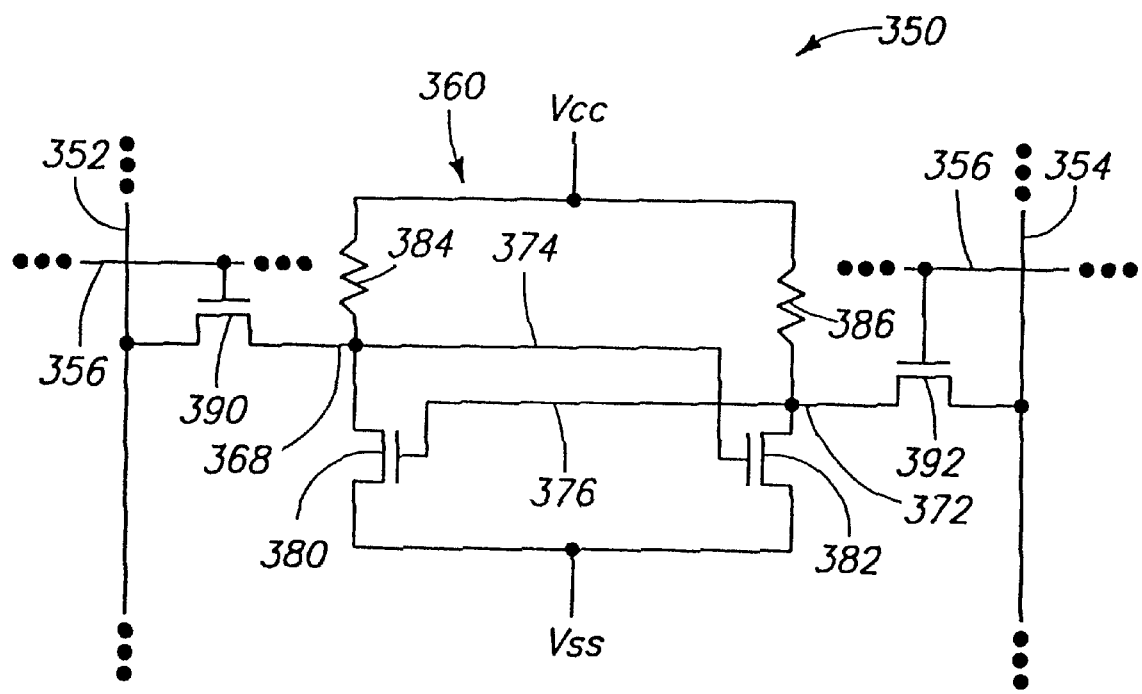
FIG. 1 is a schematic representation of a four transistor SRAM cell, and is discussed principally in the "Background" section above.

This disclosure of the invention is submitted in furtherance of the constitutional purposes of the U.S. Patent Laws "to promote the progress of science and useful arts" (Article 1, Section 8).

In accordance with one aspect of the invention, a method of forming a pair of field effect transistors having different thickness gate dielectric layers comprises the following steps:

providing a first region on a substrate for formation of a first field effect transistor having a first gate dielectric layer of a first thickness and providing a second region on the substrate for formation of a second field effect transistor having a second gate dielectric layer of a second thickness;

providing the first gate dielectric layer and a first conductive gate layer over the first and second regions;

patterning the first conductive layer to define a first gate of the first field effect transistor in the first region while leaving the first conductive layer not patterned for gate formation for the second field effect transistor in the second region;

after defining the first gate, stripping the first conductive layer and the first gate dielectric layer from the second region;

after stripping the first conductive layer and the first gate dielectric layer from the second region, providing the second gate dielectric layer and a second conductive gate layer over the second region; and patterning the second conductive layer in the second region to define a second gate of the second field effect transistor in the second region.

In accordance with another aspect of the invention, a method of forming an SRAM cell comprises the following steps:

providing a first region on a bulk semiconductor substrate for formation of an NMOS access transistor and an NMOS pull down transistor having a common first gate dielectric layer of a first thickness and providing a second region on the semiconductor substrate for formation of a second field effect transistor having a second gate dielectric layer of a second thickness;

providing the first gate dielectric layer and a first conductive gate layer over the first and second regions;

patterning the first conductive layer to define a gate of the NMOS access transistor and a gate of the NMOS pull down transistor in the first region while leaving the first conductive layer not patterned for gate formation for the second field effect transistor in the second region;

after defining the access transistor gate and the pull down transistor gate, providing an insulating dielectric layer over the first region and the second region;

etching the insulating dielectric layer to form a contact opening in the first region to the pull down transistor gate and to outwardly expose the first conductive gate layer in the second region;

providing a layer of semiconductive material outwardly of the insulating dielectric layer and within the contact opening in electrical connection with the pull down transistor gate;

providing a layer of photoresist over the layer of semiconductive material, the photoresist layer being patterned for definition of an SRAM load resistor from the semiconductive material layer in the first region and leaving the second region outwardly exposed;

etching the layer of semiconductive material to define the load resistor shape and stripping the first conductive layer from the second region using the patterned photoresist layer as a common mask for such etching and stripping;

after defining the load resistor shape, stripping the semiconductive material, the first conductive layer and the first gate dielectric layer from the second region;

after stripping the semiconductive material, the first conductive layer and the first gate dielectric layer from the second region, providing the second gate dielectric layer and a second conductive gate layer over the first region and the second region; and patterning the second conductive layer to, a) define a second gate of the second field effect transistor in the second region, and b) define a capacitor dielectric layer comprising the second gate dielectric layer and a capacitor plate of a capacitor within the first region.

Figure 2:
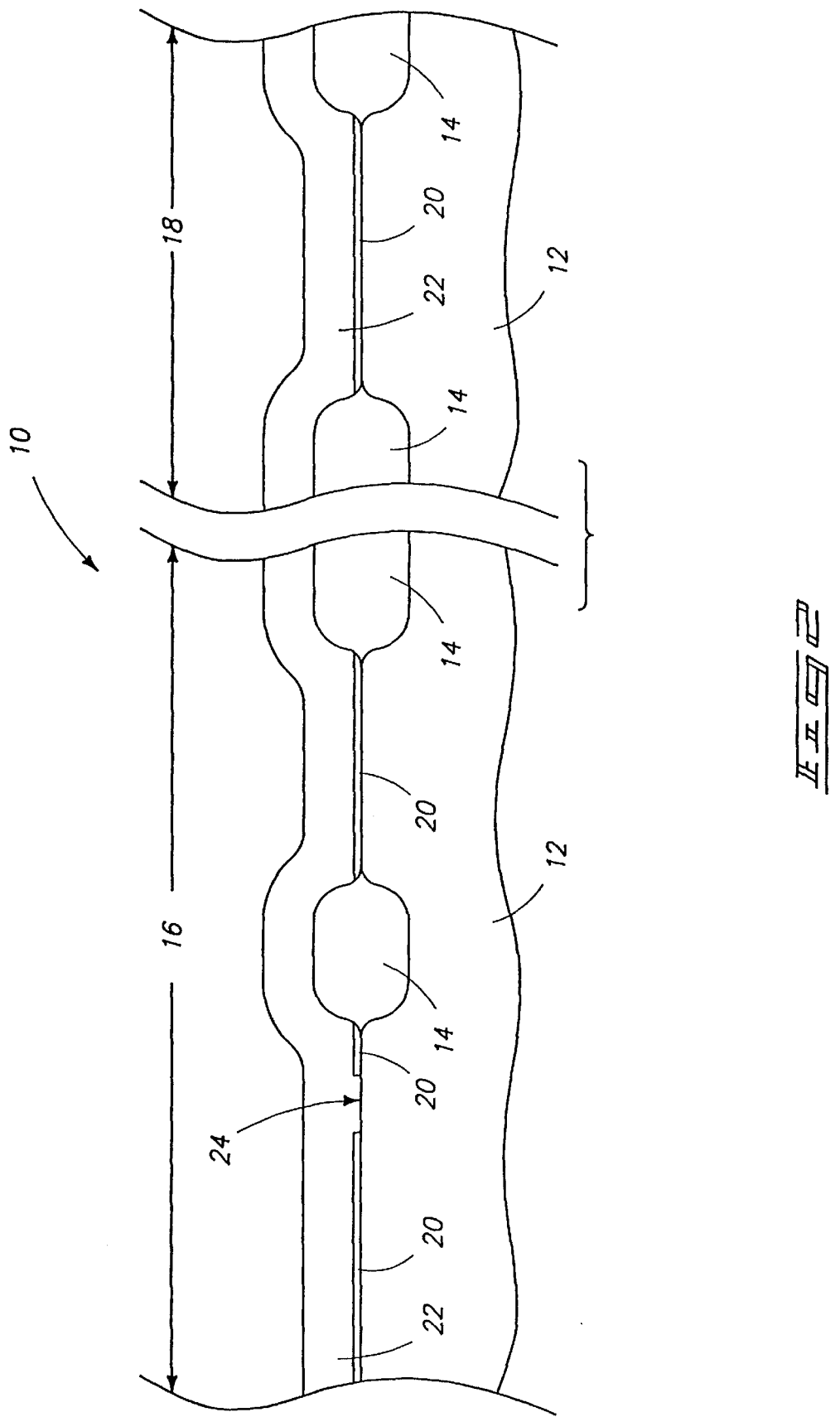
FIG. 2 is a diagrammatic fragmentary sectional view of a semiconductor wafer fragment at one processing step in accordance with the invention.

FIG. 2 illustrates a semiconductor wafer fragment in process indicated generally with reference numeral 10. Such is comprised of a bulk silicon substrate 12 and field oxide regions 14. In the preferred embodiment, such is utilized in formation of SRAM circuitry. Wafer fragment 10 comprises a first region 16 for formation of an NMOS access transistor and an NMOS pull down transistor having a common first gate dielectric layer of a first thickness. A second region 18 is provided for formation of a second field effect transistor having a second gate dielectric layer of a second thickness. A first gate dielectric layer 20 and a first conductive gate layer 22 are provided over first region 16 and second region 18. A contact opening 24 is provided to bulk substrate 12 within first region 16.

Figure 3:
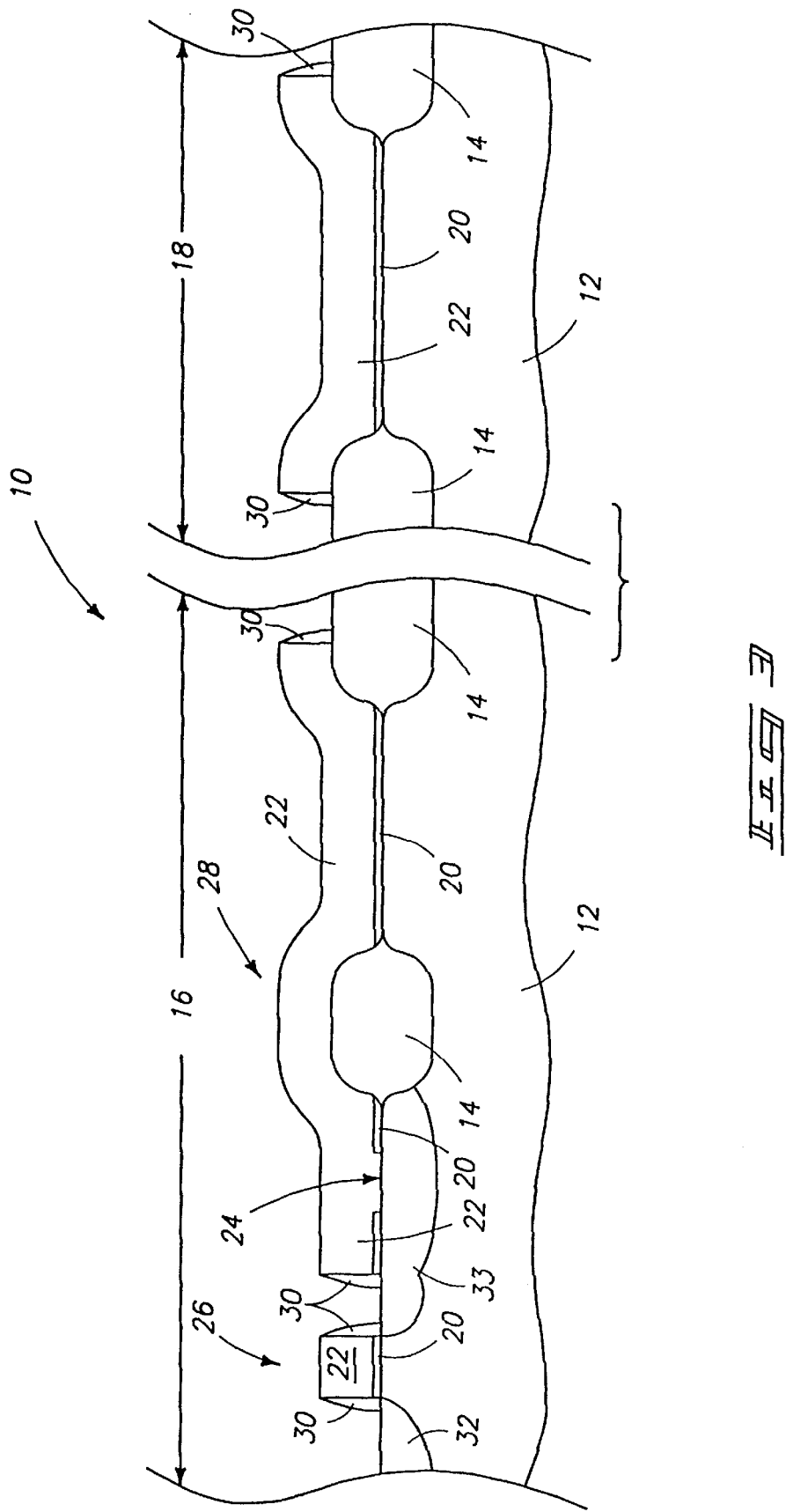
FIG. 3 is a view of the FIG. 2 wafer at a processing step subsequent to that shown by FIG. 2.

Referring to FIG. 3, first conductive layer 22 and first gate dielectric layer 20 are patterned to define a gate 26 of the NMOS access transistor and a gate 28 of the NMOS pull down transistor within first region 16. First conductive layer 22 and first gate dielectric layer 20 might also be patterned as shown within second region 18, but not patterned for final gate formation for the second field effect transistor in second region 18. Such will be provided for subsequently in the provision of different layers. Insulating sidewall spacers 30 are provided about first conductive gate layer 28. N+ diffusion regions 32 and 33 are provided in bulk substrate 12, and comprise the source and drain regions of the first or NMOS access transistor in first region 16. With respect to the SRAM schematic of FIG. 1, gate 26 comprises the gate of transistor 39a, while gate 28 comprises the gate of transistor 38a. Region 33 constitutes a common diffusion region electrically interconnecting transistor 39a and 38a, such as is depicted by the schematic.

It is to be understood that additional processing can and would most likely occur with respect to Vss contacts, bit contacts, lines, substrate implants, etc. Such are not shown or further described for clarity of the invention, and are not material to that which constitutes the claimed invention.

Figure 4:
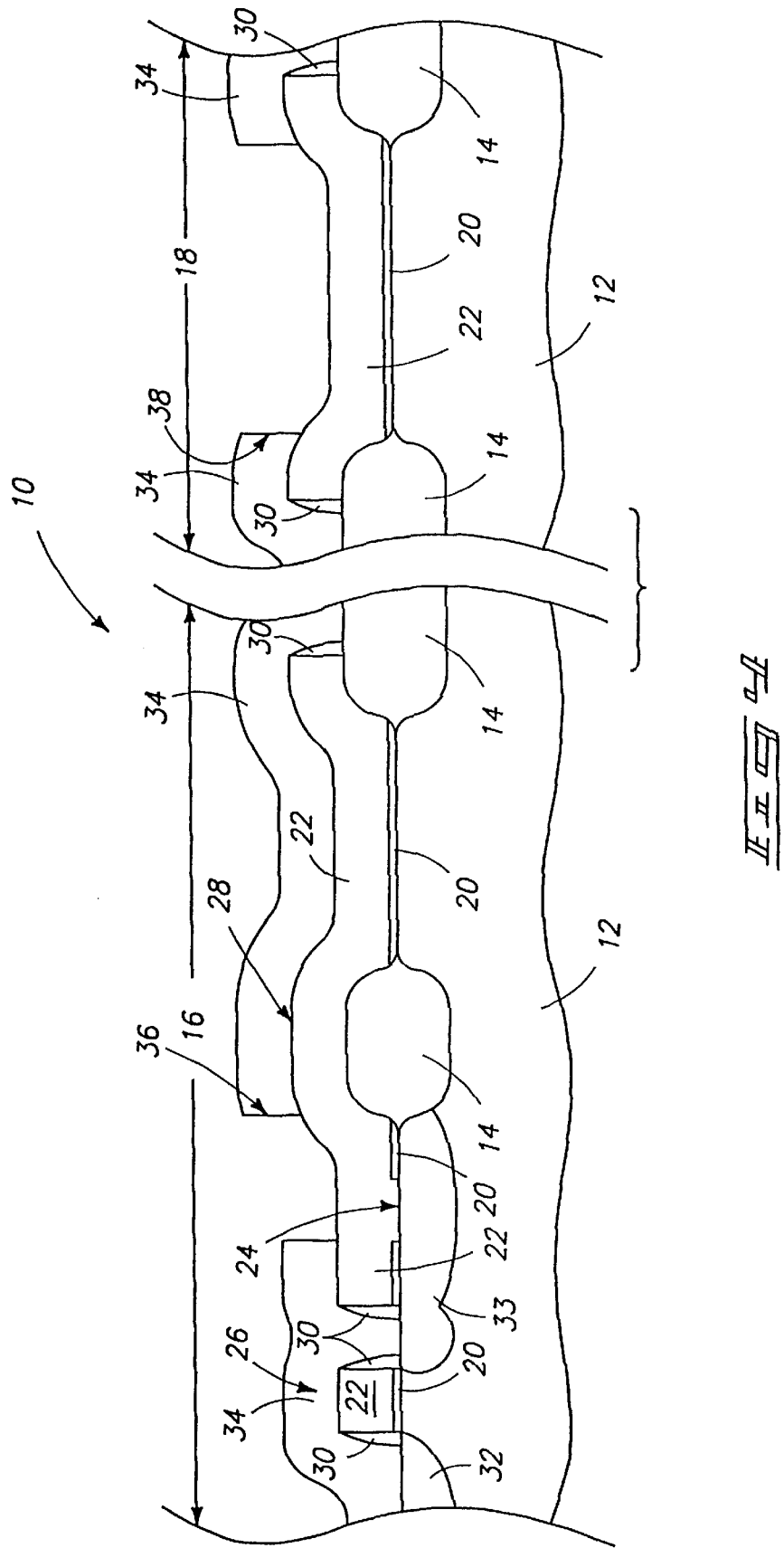
FIG. 4 is a view of the FIG. 2 wafer at a processing step subsequent to that shown by FIG. 3.

Referring to FIG. 4, an insulating dielectric layer 34, such as silicon dioxide, is provided over first region 16 and second region 18. Such layer is patterned and etched to form contact opening 36 in first region 16 to pull down transistor gate 28, and to outwardly expose first conductive gate layer 22 in second region 18 via a contact opening 38.

Referring to FIG. 5, a layer 40 of a device component material, preferably a semiconductive material such as polysilicon, is provided outwardly of insulating dielectric layer 34 and within contact opening 36 in electrical connection with pull down transistor gate 28. Layer 40 also is provided within contact opening 38. Layer 40 is patterned and implanted or otherwise diffusion doped as shown to provide the illustrated p-type region relative to surrounding the n+ region.

Referring to FIG. 6, a layer 42 of photoresist is provided and patterned over semiconductive material layer 40 for definition of an SRAM load resistor (such as load resistor 38b in FIG. 2) from semiconductive material layer 40 in first region 16, and leaving second region 18 outwardly exposed. Subsequently as shown, semiconductive material layer 40 is etched to define a load resistor shape 44. Also with photoresist layer 42 in place, device component layer 40 and first conductive layer 22 are stripped. Thus, photoresist mask 42 is used as a common mask for definition of the device component in the form of resistor 44 as well as stripping of the first conductive layer from the second region. After stripping the photoresist, the first dielectric layer in second region 18 is stripped, preferably by wet processing using HF.

Referring to FIG. 7, and after suitable cleaning steps, a second gate layer 48 of a desired secondary optimal thickness is grown, followed by providing a second conductive gate layer 50. Such layers are provided at least within second region 18, and preferably within first region 16, as shown.

Referring to FIG. 8, second conductive layer 50 is patterned to define a second gate 52 of the second field effect transistor within second region 18, and simultaneously pattern second conductive layer 50 and gate dielectric layer 48 within first region 16 for creation of a device within first region 16, with such being in the preferred and described embodiment, a capacitor construction 55. Such device 55 in the illustrated embodiment comprises a capacitor construction provided in capacitive relationship with patterned SRAM load resistor 44. The purpose of such capacitor construction is to minimize or reduce soft errors the result of alpha particles or cosmic ray events. Thus, second conductive layer 50 is patterned within first region 16 to define a conductive component of a device within first region 16, which in the illustrated and described embodiment is a capacitor plate. Subsequent conventional processing would be conducted to provide a source and a drain for the transistor in region 18.

Thus, an integrated process is provided whereby different thickness gate dielectric layers can be provided for first and second transistors in different regions of a substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a pair of field effect transistors comprising:

defining a first region on a substrate for formation of a first field effect transistor and defining a second region on the substrate for formation of a second field effect transistor;

forming a first conductive gate layer over the first and second regions;

forming the first conductive gate layer into a first gate of the first field effect transistor in the first region;

forming a device component material over the first and second regions;

after forming the first gate, removing the first conductive gate layer and the device component material from the second region;

after removing the first conductive gate layer and the device component material, forming a second conductive layer in the second region and forming a second gate of the second field effect transistor from the second conductive layer; and further comprising defining source and drain regions of the first field effect transistor in the first region prior to removing the first conductive layer from the second region.

2. A method of forming a pair of field effect transistors having different thickness gate dielectric layers comprising the following steps:

defining a first region on a substrate for formation of a first field effect transistor and defining a second region on the substrate for formation of a second field effect transistor;

forming a first gate dielectric layer and a first conductive gate layer over the first and second regions, the first gate dielectric layer having a first thickness;

forming a first gate of the first field effect transistor in the first region from the first conductive layer;

after forming the first gate, forming an insulating dielectric layer over the first region and the second region;

after forming the insulating dielectric layer, forming a device component over the first region;

removing the first conductive layer from the second region;

after removing the first conductive layer from the second region, forming a second gate dielectric layer and a second conductive gate layer over the second region, the second gate dielectric layer having a second thickness different than the first thickness; and forming a second gate of the second field effect transistor in the second region from the second conductive gate layer.

3. The method of forming a pair of field effect transistors of claim 2 wherein the forming the device component comprises forming a device component layer over the first and second regions, the removing the first conductive layer from the second region comprising removing the device component layer from the second region.

4. The method of forming a pair of field effect transistors of claim 2 wherein the first gate dielectric layer is removed from the second region prior to forming the second gate dielectric layer.

5. The method of forming a pair of field effect transistors of claim 2 wherein the second conductive layer is formed in the first region, the forming the second gate in the second region comprising simultaneously patterning the second conductive layer in the first region to define a conductive component of a device within the first region.

6. The method of forming a pair of field effect transistors of claim 2 wherein the second conductive layer is formed in the first region, the step of patterning the second conductive layer in the second region comprising simultaneously patterning the second conductive layer in the first region to define a capacitor plate of a capacitor within the first region.

7. The method of forming a pair of field effect transistors of claim 2 further comprising defining source and drain regions of the first field effect transistor in the first region prior to stripping the first conductive layer and the first gate dielectric layer from the second region.

8. The method of forming a pair of field effect transistors of claim 2 wherein the device component material is semiconductive, and the device component is a resistor.

9. A method of forming a pair of field effect transistors having different thickness gate dielectric layers comprising the following steps:

defining a first region on a substrate for formation of a first field effect transistor and defining a second region on the substrate for formation of a second field effect transistor;

forming a first gate dielectric layer and a first conductive gate layer over the first and second regions, the first gate dielectric layer having a thickness;

forming a first gate of the first field effect transistor from the first conductive layer;

after forming the first gate, removing the first conductive layer from the second region;

after removing the first conductive layer from the second region, forming a second gate dielectric layer and a second conductive gate layer over the first region and the second region, the second gate dielectric layer having a thickness different than the first gate dielectric layer;

forming a second gate of the second field effect transistor from the second conductive gate layer;

forming a capacitor dielectric layer from the second gate dielectric layer over the first region; and forming a capacitor plate from the second conductive gate layer over the first region.

10. The method of forming a pair of field effect transistors of claim 9 further comprising defining source and drain regions of the first field effect transistor in the first region prior to removing the first conductive layer from the second region.

11. A method of forming an SRAM cell comprising the following steps:

providing a first region on a bulk semiconductor substrate for formation of an NMOS access transistor and an NMOS pull down transistor having a common first gate dielectric layer of a first thickness and providing a second region on the semiconductor substrate for formation of a second field effect transistor having a second gate dielectric layer of a second thickness;

providing the first gate dielectric layer and a first conductive gate layer over the first and second regions; patterning the first conductive layer to define a gate of the NMOS access transistor and a gate of the NMOS pull down transistor in the first region while leaving the first conductive layer not patterned for gate formation for the second field effect transistor in the second region;

after defining the access transistor gate and the pull down transistor gate, providing an insulating dielectric layer over the first region and the second region;

etching the insulating dielectric layer to form a contact opening in the first region to the pull down transistor gate and to outwardly expose the first conductive gate layer in the second region;

providing a layer of polysilicon outwardly of the insulating dielectric layer and within the contact opening in electrical connection with the pull down transistor gate;

providing a layer of photoresist over the layer of polysilicon, the photoresist layer being patterned for definition of an SRAM load resistor from the polysilicon layer in the first region and leaving the second region outwardly exposed;

etching the layer of polysilicon to define the load resistor shape and stripping the first conductive layer from the second region using the patterned photoresist layer as a common mask for such etching and stripping;

after defining the load resistor shape, stripping the polysilicon, the first conductive layer and the first gate dielectric layer from the second region;

after stripping the polysilicon, the first conductive layer and the first gate dielectric layer from the second region, providing the second gate dielectric layer and a second conductive gate layer over the first region and the second region; and patterning the second conductive layer to, a) define a second gate of the second field effect transistor in the second region, and b) define a capacitor dielectric layer comprising the second gate dielectric layer and a capacitor plate of a capacitor within the first region.

12. The method of forming an SRAM cell of claim 11 wherein the step of patterning the second conductive layer comprises patterning to define the capacitor dielectric layer and capacitor plate over and in capacitive relationship with the patterned SRAM load resistor.

* * * * *

UNITED STATES PATENT AND TRADEMARK OFFICE
CERTIFICATE OF CORRECTION

PATENT NO : 5,989,946

DATED : November 23, 1999

INVENTOR(S) : Jeffrey W. Honeycutt

It is certified that error appears in the above-identified patent and that said Letters Patent is hereby corrected as shown below:

On the fourth line of the Abstract delete "s"

Signed and Sealed this

Fourteenth Day of November, 2000

*Attest:*

Q. TODD DICKINSON

*Attesting Officer*      *Director of Patents and Trademarks*